(12) United States Patent
Sharma et al.

(10) Patent No.: US 6,903,403 B2
(45) Date of Patent: Jun. 7, 2005

(54) MAGNETIC MEMORY CELL HAVING AN ANNULAR DATA LAYER AND A SOFT REFERENCE LAYER

(75) Inventors: Manish Sharma, Mountain View, CA (US); Lung Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/902,925

(22) Filed: Jul. 30, 2004

(65) Prior Publication Data

US 2005/0014320 A1 Jan. 20, 2005

Related U.S. Application Data

(62) Division of application No. 10/233,109, filed on Aug. 30, 2002, now Pat. No. 6,803,274.

(51) Int. Cl.[7] .................. H01L 27/108; H01L 29/76; H01L 29/94
(52) U.S. Cl. .................. 257/298; 257/300; 365/158; 365/171; 365/173; 428/692; 438/3

(58) Field of Search ............. 257/68, 71, 296, 257/298, 300; 365/98, 129, 147, 157, 158, 171, 173; 438/692, 3, 257, 263, 264, 269

(56) References Cited

U.S. PATENT DOCUMENTS

| | | | | |
|---|---|---|---|---|
| 5,389,566 A | * | 2/1995 | Lage | 438/3 |
| 5,477,482 A | * | 12/1995 | Prinz | 365/129 |
| 5,541,868 A | * | 7/1996 | Prinz | 365/98 |
| 5,661,062 A | * | 8/1997 | Prinz | 438/3 |
| 6,436,526 B1 | * | 8/2002 | Odagawa et al. | 428/332 |

* cited by examiner

Primary Examiner—Asok Kumar Sarkar

(57) ABSTRACT

An exemplary nonvolatile memory array comprises a substrate and a plurality of memory cells formed on the substrate, each of the memory cells being addressable via at least first and second conductors during operations. An exemplary memory cell in the exemplary memory array includes a ferromagnetic annular data layer having an opening, the opening enabling the second conductor to electrically contact the first conductor, an intermediate layer on at least a portion of the annular data layer, and a soft reference layer on at least a portion of the intermediate layer.

3 Claims, 13 Drawing Sheets

MAGNETIC MEMORY CELL HAVING AN ANNULAR DATA LAYER AND A SOFT REFERENCE LAYER

CROSS REFERENCE TO RELATED APPLICATIONS

This application is a divisional of application Ser. No. 10/233,109, filed Aug. 30, 2002, which is now U.S. Pat. No. 6,803,274.

BACKGROUND

Generally, a memory chip comprises a plurality of memory cells that are deposited onto a silicon wafer and addressable via an array of column conducting leads (bit lines) and row conducting leads (word lines). That is, the intersection of a bit line and a word line typically constitutes the address of a memory cell. The memory cells are controlled by specialized circuits that perform functions such as identifying rows and columns of memory cells to read data from or write data to. Typically, each memory cell stores data in the form of a "1" or a "0," representing a bit of data.

An array of magnetic memory cells is often called magnetic random access memory or MRAM. MRAM is generally nonvolatile memory (i.e., a solid state chip that retains data when power is turned off). At least one type of magnetic memory cell includes a data layer and a reference layer that is separated from the data layer by an intermediate layer. The data layer may also be referred to as a bit layer, a storage layer, a sense layer, and/or other known terminology. In a magnetic memory cell, a bit of data (e.g., a "1" or "0") may be stored by "writing" into the data layer via one or more conducting leads (e.g., a bit line and a word line). The write operation is typically accomplished via a write current that sets the orientation of the magnetic moment in the data layer to a predetermined direction.

Once written, the stored bit of data may be read by providing a read current through one or more conducting leads (e.g., a read line) to the reference layer. In at least one type of magnetic memory cell, the read current sets the orientation of the magnetic moment of the reference layer in a predetermined direction. For each memory cell, the orientations of the magnetic moments of the data layer and the reference layer are either parallel (in the same direction) or anti-parallel (in different directions) to each other. The degree of parallelism affects the resistance of the cell, and this resistance can be determined by sensing (e.g., via a sense amplifier) an output current produced by the memory cell in response to the read current.

More specifically, if the magnetic moments are parallel, the resistance determined based on the output current is of a first relative value (e.g., relatively low). If the magnetic moments are anti-parallel, the resistance determined is of a second relative value (e.g., relatively high). The relative values of the two states (i.e., parallel and anti-parallel) are typically different enough to be sensed distinctly. A "1" or a "0" may be assigned to the respective relative resistance values depending on design specification.

In at least one type of magnetic memory cell, the data layer and the reference layer are implemented using differing magnetic hardnesses. For example, the data layer may be magnetically harder and the reference layer may be magnetically softer. A harder layer typically has a relatively fixed magnetic state and its magnetic moment is oriented in one direction. It takes a relatively greater current to reverse the direction of the magnetic moment in a hard layer. The magnetic moment orientation in the soft layer is more readily reversible. The intermediate layer may comprise insulating material (e.g., dielectric), non-magnetic conducting material, and/or other known materials, and is usually thick enough to prevent exchange coupling between the data and reference layers. The various conducting leads which are used to address the memory cells (e.g., bit lines, word lines, and read lines), and to provide currents to pass through the data and reference layers to read data from or write data to the memory cells are provided by one or more additional layers, called conducting layer(s).

The layers described above and their respective characteristics are typical of magnetic memory cells based on tunneling magnetoresistance (TMR) effects known in the art. Other combinations of layers and characteristics may be used to make magnetic memory cells based on TMR effects. For example, a pinned reference layer and an anti-ferromagnetic layer may be used in place of the soft reference layer described above. This configuration of TMR memory cells is well known in the art and need not be described in more detail herein. See, for example, U.S. Pat. No. 6,404,674, issued to Anthony et al., and co-pending U.S. application Ser. Nos.: (1) 09/825,093, entitled "Cladded Read Conductor For A Pinned-On-The-Fly Soft Reference Layer", filed on Apr. 2, 2001; and (2) Ser. No. 09/963,171, entitled "Magneto-Resistive Device Having Soft Reference Layer", filed on Sep. 25, 2001, which are hereby incorporated by reference in their entirety for all purposes.

Still other configurations of magnetic memory cells based on other well known physical effects (e.g., giant magnetoresistance (GMR), anisotropic magnetoresistance (AMR), colossal magnetoresistance (CMR), and/or other physical effects) may be implemented with various embodiments described herein.

Throughout this application, various exemplary embodiments will be described in reference to the TMR memory cells having a relatively hard data layer, and relative soft reference layer, as described above. Those skilled in the art will readily appreciate that the exemplary embodiments may also be implemented with other types of magnetic memory cells known in the art (e.g., other types of TMR memory cells, GMR memory cells, AMR memory cells, CMR memory cells, etc.) according to the requirements of a particular implementation.

Generally speaking, desirable characteristics for any configuration of memory device include increased speed, reduced power consumption, and/or lower cost. A simpler fabrication process and/or a smaller chip size may achieve lower cost. However, as magnetic memory cells become smaller, typically, higher operating current is required for achieving "read" and/or "write" operations. Magnetic polarity increases in strength as memory cell surface area decreases. As a result, an increased (re)write current is generally needed to reverse the polarity of one or more layers of the memory cell. Higher operating current is undesirable because it goes hand-in-hand with higher power requirements, relatively complicated write circuitry, wider conducting leads, and increased cost.

Thus, a market exists for improved memory cell configurations that use lowered operating current in high density MRAM devices.

SUMMARY

Implementations of the various exemplary memory cell structures to be described herein may result in one or more advantages, including, without limitation, fewer and narrower conductors, lowered manufacturing costs, lowered operating currents, lowered power requirements, simplified sense and write circuitry, and increased memory cell density.

An exemplary nonvolatile memory array comprises a substrate and a plurality of memory cells formed on the substrate, each of the memory cells being addressable via at least first and second conductors during operations. An exemplary memory cell in the exemplary memory array includes a ferromagnetic annular data layer having an opening, the opening enabling the second conductor to electrically contact the first conductor, an intermediate layer on at least a portion of the annular data layer, and a soft reference layer on at least a portion of the intermediate layer. In an exemplary implementation, the opening surrounds conducting material that forms a portion of the second conductor and is not electrically insulated from the annular data layer. In another exemplary implementation, one or more conductors in the memory array are partially or wholly clad by one or more soft ferromagnetic cladding layer(s).

DETAILED DESCRIPTION

I. Overview

Exemplary improved magnetic memory cells and exemplary manufacturing processes for making those magnetic memory cells are described herein. Section II describes a first exemplary improved magnetic memory cell. Section III describes an exemplary process for making the first exemplary improved magnetic memory cell. Section IV describes a second exemplary improved magnetic memory cell. Section V describes an exemplary process for making the second exemplary improved magnetic memory cell. Section VI describes a third exemplary improved magnetic memory cell. Section VII describes an exemplary process for making the third exemplary improved magnetic memory cell. Section VIII describes an exemplary memory array, an exemplary circuit representation, and other exemplary aspects of an exemplary memory cell.

II. A First Exemplary Improved Memory Cell Configuration

Figure 1:
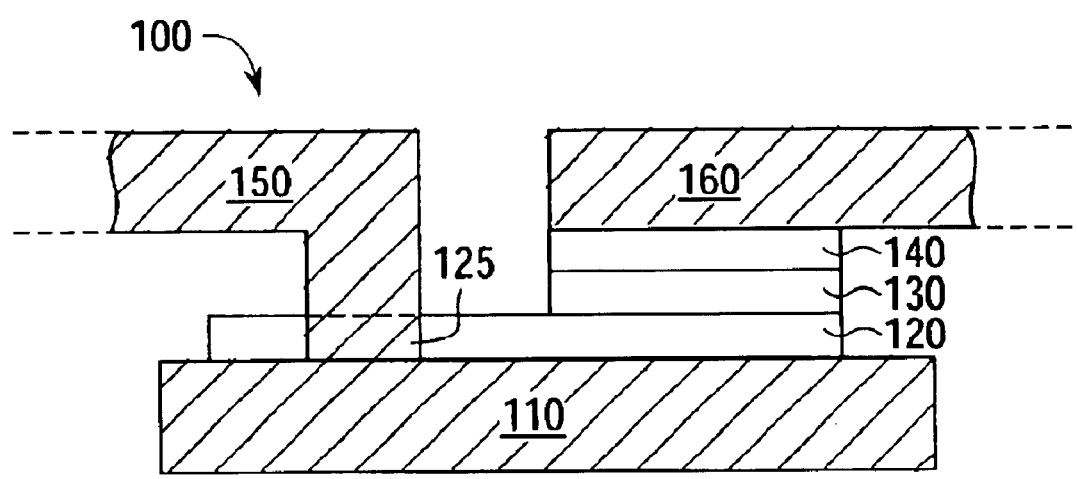
FIG. 1 illustrates an exemplary improved magnetic memory cell configuration.

FIG. 1 illustrates an elevation view of an exemplary improved magnetic memory cell 100. The memory cell 100 includes a first conductor 110, an annular data layer 120 having an opening 125 on top of a portion of the first conductor 110, an intermediate layer 130 (e.g., a tunnel barrier layer, a non-magnetic conducting layer, and/or other material) on top of a portion of the annular data layer 120, a soft reference layer 140 on top of the intermediate layer 130, a second conductor 150, and a third conductor 160 on top of the soft reference layer 140. In the exemplary configuration illustrated in FIG. 1, the second conductor 150 contacts the first conductor 110 via the opening (e.g., a hole, a via, etc.) 125 in the annular data layer 120. The second conductor 150 and the third conductor 160 are electrically insulated from each other, and they may or may not be located in the same plane. As will be described in Section III below, the second and third conductors 150, 160 can optionally be formed in the same fabrication steps, thus, reducing manufacturing cost by eliminating fabrication steps needed for separately forming a conductor.

The first, second, and third conductors 110, 150, 160, may be made of copper (Cu), Aluminum (Al), Aluminum Copper (AlCu), Tantalum (Ta), Gold (Au), Silver (Ag), alloys of one or more of the above, and/or other conducting material(s) and alloy(s). The conductors may be formed by known Copper Damascene processes using deposition techniques known in the art (e.g., sputtering, evaporation, electroplating, etc.). In an exemplary implementation appropriate for some contemporary memory devices, the thickness of a conductor is approximately 0.1 to 1 $\mu$m.

The annular data layer 120 may comprise one or more ferromagnetic materials. In an exemplary embodiment, ferromagnetic materials suitable for the data layer 120 include, without limitation, nickel iron (NiFe), nickel iron cobalt (NiFeCo), cobalt iron (CoFe), other magnetic alloys of NiFe and Co, doped amorphous ferromagnetic alloys, PERMALLOY™, and other materials. See, for example, hard ferromagnetic alloys as described in U.S. Pat. No. 4,402,770, issued to Koon, which patent is hereby incorporated by reference for all purposes.

The term "annular" as used herein in all Sections means a closed loop. The closed loop may be a ring, a washer, a toroid, an ellipse, and/or still other forms of closed loops. For example, in plan view, the closed loop could include inner and outer perimeters, which are circular, oval, square, and rectangular, etc., including any combination thereof. The annular data layer 120 constitutes a closed magnetic circuit, which may be formed by processes known in the art and need not be described in more detail herein. See, for example, U.S. Pat. No. 5,541,868, issued to Prinz, which is hereby incorporated by reference for all purposes.

In some configurations, the second conductor 150 may be effectively clad within the annular data layer 120, thus, significantly reducing fringe magnetic fields emanating from the second conductor 150 during operations. As a result of reduced fringe magnetic fields (thus, reduced magnetic interference) and other reasons memory cell density can be increased.

In an exemplary embodiment, the intermediate layer 130 is a tunnel barrier layer (e.g., if the memory cell 100 is a TMR memory cell). In this embodiment, the intermediate layer 130 may be made of silicon oxide ($SiO_2$), silicon nitride ($SiN_x$), magnesium oxide (MgO), aluminum oxide ($Al_2O_3$), aluminum nitride ($AlN_x$), tantalum oxide ($TaO_x$), and/or other insulating material(s). In an exemplary implementation appropriate for some contemporary memory devices, the thickness of a tunnel barrier layer is approximately 0.5 to 10 nanometers.

In another exemplary embodiment, the intermediate layer 130 is a non-magnetic conducting layer (e.g., if the memory cell 100 is a GMR memory cell). In this embodiment, the intermediate layer 130 may be made of copper (Cu), gold (Au), silver (Ag), and/or transition metal material(s). In an exemplary implementation appropriate for some contemporary memory devices, the thickness of a non-magnetic conducting layer is approximately 0.5 to 5 nanometers.

The soft reference layer 140 may comprise one or more ferromagnetic materials. In an exemplary embodiment, ferromagnetic materials suitable for the reference layer 140 include nickel iron (NiFe), nickel iron cobalt (NiFeCo), cobalt iron (CoFe), other magnetic alloys of NiFe and Co, doped amorphous ferromagnetic alloys, PERMALLOY™, and other materials. See, for example, soft ferromagnetic alloys as described in U.S. Pat. No. 4,402,043, issued to Koon, which hereby incorporated by reference for all purposes. In an exemplary implementation appropriate for some contemporary memory devices, the thickness of the soft reference layer 140 is approximately 1 to 100 nanometers.

Figure 2A:
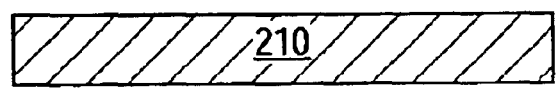
FIGS. 2a–2g illustrate an exemplary process for making the exemplary improved magnetic memory cell of FIG. 1.

III. An Exemplary Manufacturing Process for the First Exemplary Improved Memory Cell FIGS. 2a–2g illustrate an exemplary process for manufacturing the exemplary improved memory cell as shown in FIG. 1 above. In FIG. 2a, a first conducting layer 210 is formed (e.g., via sputtering, evaporation, electroplating, and/or other known methods). The conducting layer 210 is patterned and etched to form the first conductor 110 (not shown).

Figure 2B:
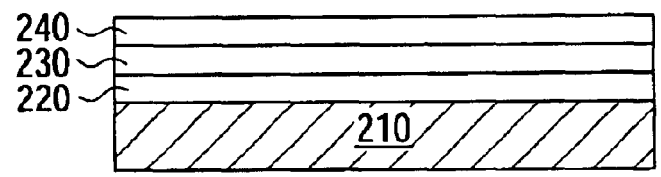

In FIG. 2b, a data layer 220, an intermediate layer (e.g., a tunnel barrier layer) 230, and a soft reference layer 240 are formed via known processing methods.

Figure 2C:
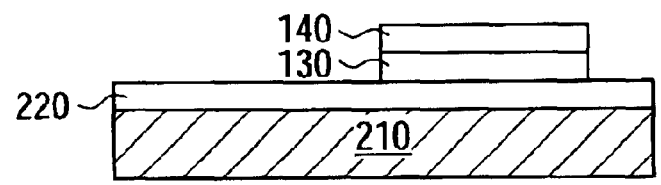

In FIG. 2c, a portion of the intermediate layer 230 and the soft reference layer 240 are etched away using known etching techniques (e.g., coating with photoresist, masking, etching, stripping, etc.). In an exemplary implementation, the remaining structure forms the intermediate layer 130 (e.g., tunnel barrier layer) and the reference layer 140 (see FIG. 1).

Figure 2D:
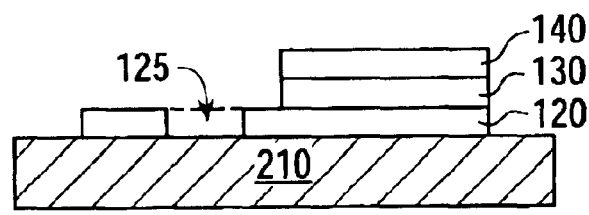

In FIG. 2d, a portion of the data layer 220 is etched away using known etching techniques. In one implementation, the data layer 220 is etched so that the data layer becomes annular (e.g., like a ring, ellipse, oval, circle, etc.) with an opening 125 approximately centered within the annular data layer 120.

Figure 2E:
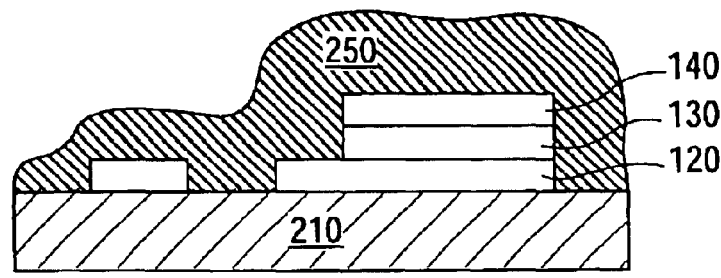

In FIG. 2e, a dielectric layer 250 is formed (e.g., via sputtering, evaporation, deposition, and/or other known techniques).

Figure 2F:
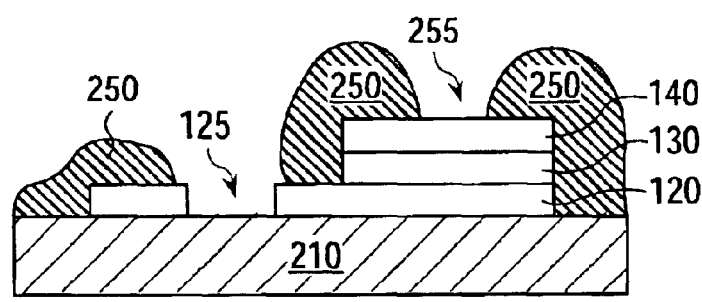

In FIG. 2f, a portion of the dielectric layer 250 is etched away by known etching techniques. In one implementation, if the dielectric material fills the opening 125 in the forming step of FIG. 2e, then such dielectric material is removed to restore the opening 125. In addition, an opening 255 is created during the etching process of FIG. 2f to expose a portion of the soft reference layer 140.

Figure 2G:
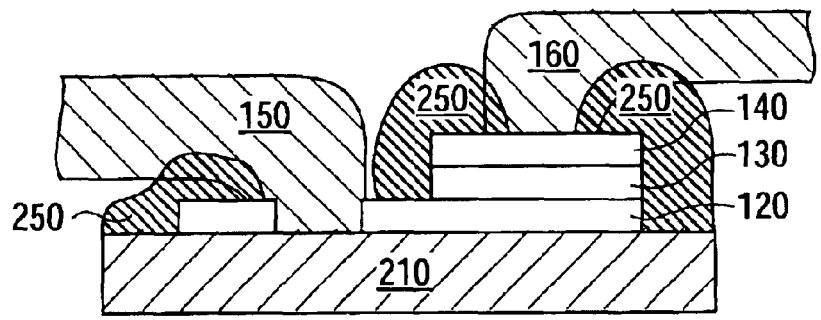

Finally, in FIG. 2g, a second conducting layer 260 is formed to fill the openings 125 and 255. In an exemplary implementation, the conducting layer 260 is patterned to form the second and third conductors 150 and 160, which are clad within the annular data layer 120 and contacting the soft reference layer 140, respectively.

In an exemplary implementation, the second and third conductors 150, 160 are formed along an axis orthogonal to the first conductor 110 (which is formed by patterning and etching the conducting layer 210). Of course, one skilled in the art will recognize that other layouts of the conductors may be used in accordance with the requirements of a particular implementation.

The manufacturing steps illustrated above are merely exemplary. Those skilled in the art will appreciate that other manufacturing steps may be used in accordance with the requirements of a particular implementation. For example, the various layers as illustrated in FIGS. 2a–2g may be formed in accordance with other manufacturing sequences (e.g., the soft reference layer 230 may be formed before the data layer 220, etc.), one or more layers may be formed at the same time, one or more layers of different materials may be combined to form a single layer (e.g., a data layer), etc.

Further, the TMR memory cell illustrated above is merely exemplary. Those skilled in the art will appreciate that other types of memory cells (e.g., GMR memory cells, etc.) may be constructed according to the requirements of a particular implementation. For example, the intermediate layer 230 may be a non-magnetic conducting layer for constructing a GMR memory cell.

IV. A Second Exemplary Improved Memory Cell Configuration

Figure 3:
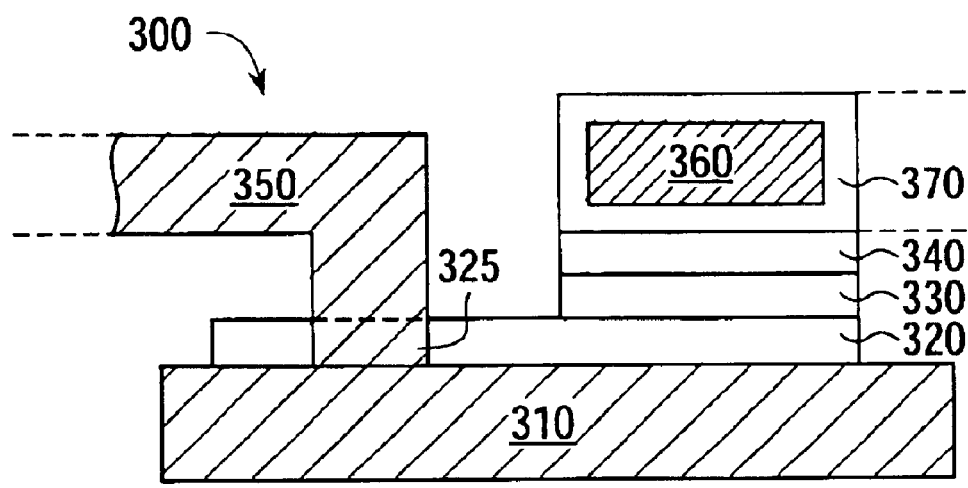
FIG. 3 illustrates another exemplary improved magnetic memory cell configuration.

FIG. 3 illustrates an elevation view of another exemplary improved magnetic memory cell 300. The memory cell 300 includes a first conductor 310, an annular data layer 320 having an opening 325 on top of a portion of the first conductor 310, an intermediate layer 330 (e.g., a tunnel barrier layer, a non-magnetic conducting layer, and/or other material) on top of a portion of the annular data layer 320, a soft reference layer 340 on top of the intermediate layer 330, a second conductor 350 contacting the first conductor 310 via the opening 325 in the annular data layer 320, and a third conductor 360 partially or wholly clad within a soft ferromagnetic cladding layer 370. For illustration purposes only, the conductor 360 in FIG. 3 is visible in the elevation view. A person skilled in the art will recognize that the third conductor 360 should extend from right to left across the page (similar to the third conductor 160 in FIG. 1) and should be hidden from view because it is clad by the soft ferromagnetic cladding layer 370. The second and third conductors 350 and 360 are electrically insulated from each other, and they may or may not be located in the same plane.

The first, second, and third conductors 310, 350, 360, the annular data layer 320, the intermediate layer 330, and the soft reference layer 340 may be made in accordance with the materials and physical configurations (e.g., size, shape, etc.) described above in Sections II and III.

The soft ferromagnetic cladding layer 370 may comprise one or more ferromagnetic materials. In an exemplary embodiment, ferromagnetic materials suitable for the soft ferromagnetic cladding layer 370 include nickel iron (NiFe), nickel iron cobalt (NiFeCo), cobalt iron (CoFe), other magnetically alloys of NiFe and Co, doped amorphous ferromagnetic alloys, PERMALLOY™, and other materials. See, for example, soft ferromagnetic alloys as described in U.S. Pat. No. 4,402,043.

In one exemplary implementation, the soft ferromagnetic cladding layer 370 may be the same material as the soft reference layer 340. In this implementation, the soft reference layer 340 may form a portion of the soft ferromagnetic cladding layer 370 (e.g., a portion of the cladding around the third conductor 360). Alternatively, the soft ferromagnetic cladding layer 370 may be made of a different material than the soft reference layer 340.

The soft ferromagnetic cladding layer 370 partially or wholly cladding the third conductor 360 provides a closed flux path for read magnetic fields, thus, less operating current may be used for at least read operations. Cladding the third conductor 360 may also reduce demagnetization and angular displacement. In some configurations, fringe magnetic fields resulting from read operations may be significantly reduced because fringe magnetic fields emanating from the third conductor 360 are substantially contained within the soft ferromagnetic cladding layer 370. As a result of reduced fringe magnetic fields (thus, reduced magnetic interference) and other reasons memory cell density can be increased.

In an exemplary implementation, the soft ferromagnetic cladding layer 370 may partially or wholly clad the third conductor 360 in accordance with exemplary processes described in U.S. Pat. No. 6,404,674 and co-pending U.S. application entitled "Cladded Read Conductor For A Pinned-On-The-Fly Soft Reference Layer", bearing application Ser. No. 09/825,093, filed on Apr. 2, 2001, which were incorporated by reference above for all purposes.

Figure 4A:
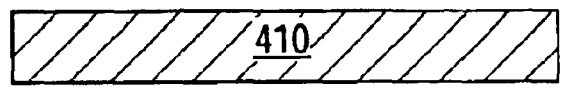
FIGS. 4a–4i illustrate an exemplary process for making the exemplary improved magnetic memory cell of FIG. 3.

V. An Exemplary Manufacturing Process for the Second Exemplary Improved Memory Cell FIGS. 4a–4i illustrate an exemplary process for manufacturing the exemplary improved memory cell as shown in FIG. 3. In FIG. 4a, a first conducting layer 410 is formed (e.g., via sputtering, evaporation, electroplating, and/or other known methods). The conducting layer 410 is patterned and etched to form the first conductor 310 (not shown).

Figure 4B:
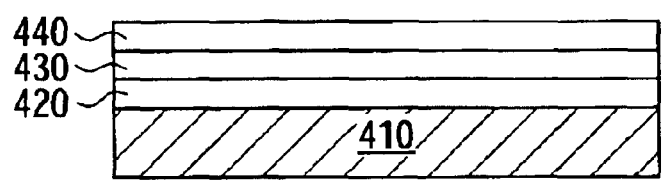

In FIG. 4b, a data layer 420, an intermediate layer (e.g., a tunnel barrier layer) 430, and a soft reference layer 440 are formed via known processing methods.

Figure 4C:
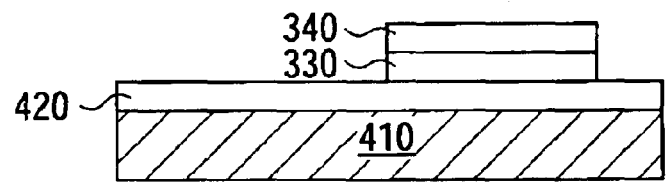

In FIG. 4c, a portion of the intermediate layer 430 and the soft reference layer 440 are etched away using known etching techniques (e.g., coating with photoresist, masking, etching, stripping, etc.). In an exemplary implementation, the remaining structure forms the intermediate layer 330 (e.g., tunnel barrier layer) and the soft reference layer 340 (see FIG. 3).

Figure 4D:
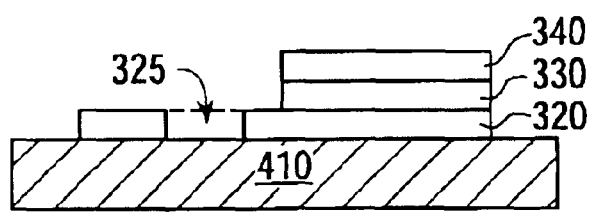

In FIG. 4d, a portion of the data layer 420 is etched away using known etching techniques. In one implementation, the data layer 420 is etched so that the data layer becomes annular (e.g., like a ring, ellipse, oval, circle, etc.) with an opening 325 approximately centered within the annular data layer 320.

Figure 4E:
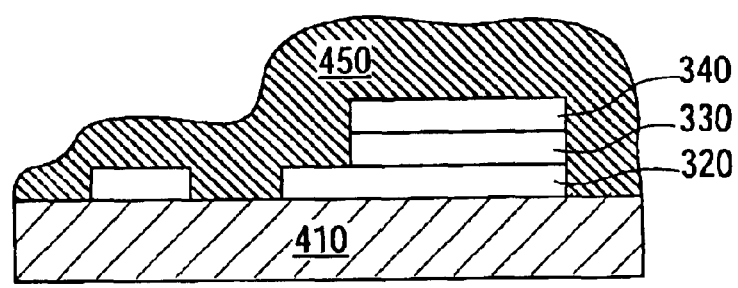

In FIG. 4e, a dielectric layer 450 is formed (e.g., via sputtering, evaporation, deposition, and/or other known techniques).

Figure 4F:
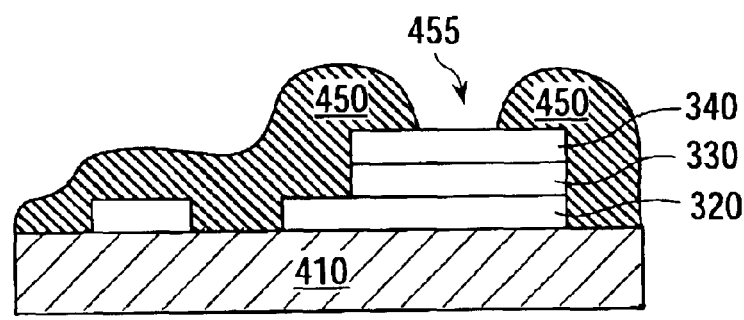

In FIG. 4f, a portion of the dielectric layer 450 is etched away by known etching techniques. In one implementation, an opening 455 is created during the etching process of FIG. 4f to expose a portion of the soft reference layer 340.

Figure 4G:
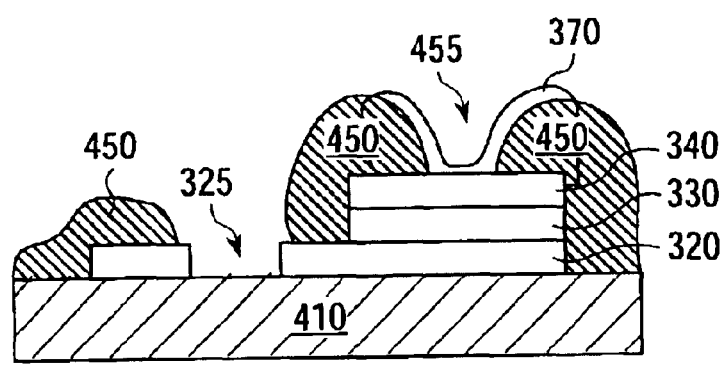

In FIG. 4g, a soft ferromagnetic layer 460 (not shown) is formed and etched so that a portion of a cladding layer 370 remains to coat a portion of the opening 455. In one implementation, if dielectric material was formed in the opening 325 in the step illustrated in FIG. 4f, such dielectric material is removed to restore the opening 325 during the etching step of FIG. 4g.

Figure 4H:
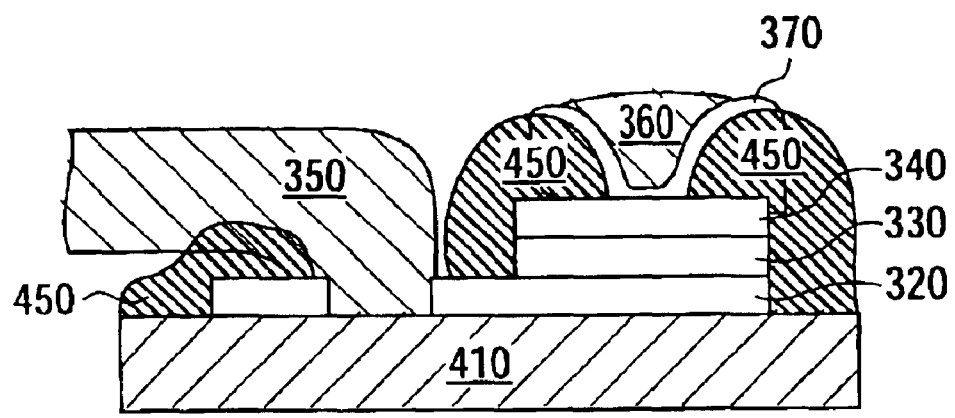

In FIG. 4h, a second conducting layer 470 is formed fill the openings 325 and 455. In an exemplary implementation, the conducting layer 470 is patterned to form the second and third conductors 350 and 360, which are clad within the annular data layer 320 and within a portion of the soft ferromagnetic cladding layer 370, respectively.

Figure 4I:
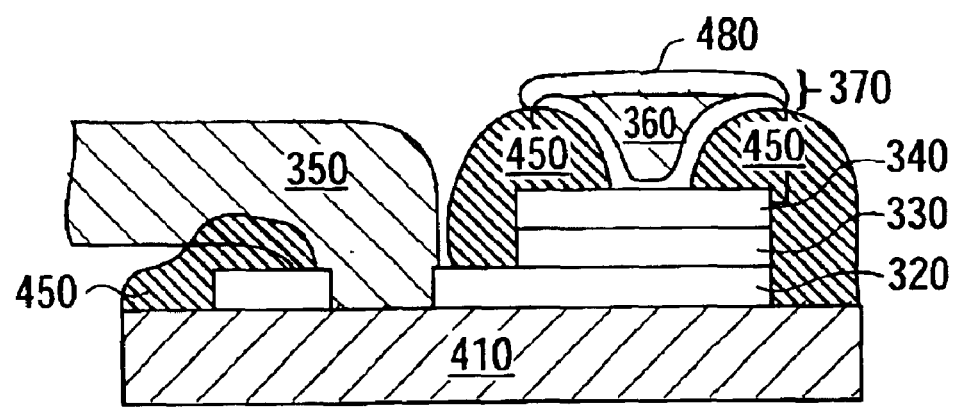

In FIG. 4i, another soft ferromagnetic layer 480 is formed and etched so that the third conductor 360 is completely clad within soft ferromagnetic cladding layer 370. The third conductor 360 is visible in FIG. 4 for illustration purposes only.

In this exemplary implementation, the third conductor 360 is partially or wholly clad within the soft ferromagnetic cladding layer 370 and extends along an axis orthogonal relative to the first conductor 310. However, one skilled in the art will recognize that other layouts may also be used in accordance with the requirements of a particular implementation.

The manufacturing steps illustrated above are merely exemplary. Those skilled in the art will appreciate that other manufacturing steps may be used in accordance with the requirements of a particular implementation. For example, the various layers as illustrated in FIGS. 4a–4i may be formed in accordance with other manufacturing sequences, one or more layers may be formed at the same time, one or more layers of different materials may be combined to form a single layer (e.g., a data layer), etc.

Further, the TMR memory cell illustrated above is merely exemplary. Those skilled in the art will appreciate that other types of memory cells (e.g., GMR memory cells, etc.) may be constructed according to the requirements of a particular implementation. For example, the intermediate layer 430 may be a non-magnetic conducting layer for constructing a GMR memory cell.

VI. A Third Exemplary Improved Memory Cell Configuration

Figure 5:
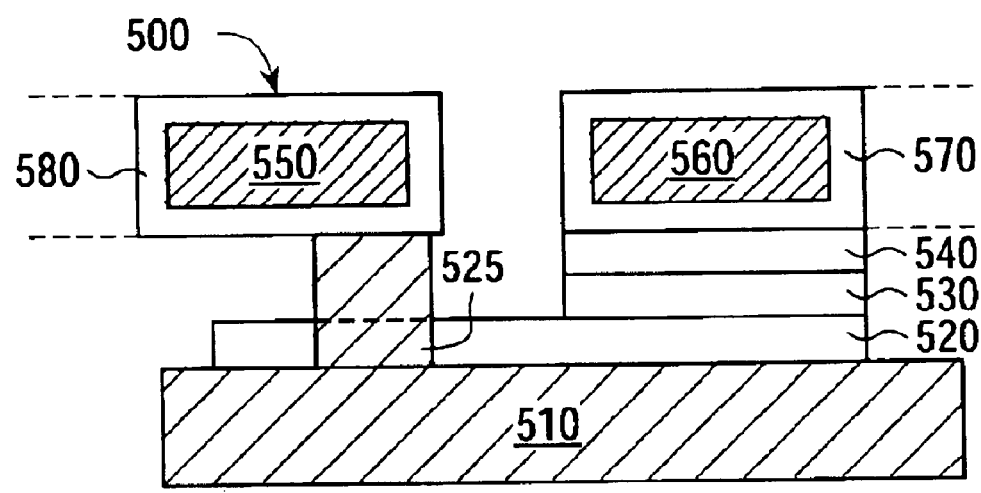
FIG. 5 illustrates yet another exemplary improved magnetic memory cell configuration.

FIG. 5 illustrates an elevation view of yet another exemplary improved magnetic memory cell 500. The memory cell 500 includes a first conductor 510, an annular data layer 520 having an opening 525 on top of a portion of the first conductor 510, an intermediate layer 530 (e.g., a tunnel barrier layer, a non-magnetic conducting layer, and/or other material) on top of a portion of the annular data layer 520, a soft reference layer 540 on top of the intermediate layer 530, a second conductor 550 contacting the first conductor 510 via the opening 525 in the annular data layer 520, and a third conductor 560 partially or wholly clad within a soft ferromagnetic cladding layer 570. In this implementation, a portion of the second conductor 550 is also clad within a soft ferromagnetic cladding layer 580.

For illustration purposes only, the second and third conductors 550 and 560 in FIG. 5 are visible in the elevation view. In this exemplary implementation, the second conductor 550 and the third conductor 560 both extend along an axis (similar to the second conductor 150 and third conductor 160 in FIG. 1) that is orthogonal relative to the first conductor 510 and are hidden from view partially or wholly by the soft ferromagnetic cladding layers 580 and 570, respectively. The second conductor 550 and the third conductor 560 are electrically insulated from each other, and they may or may not be located in the same plane.

The first, second, and third conductors 510, 550, 560, the annular data layer 520, the intermediate layer 530, and the soft reference layer 540 may be made in accordance with the materials and configurations described above in Sections II and III.

The soft ferromagnetic cladding layers 570 and 580 may be made in accordance with the materials and configurations described above in Sections IV and V regarding soft ferromagnetic cladding layer 370.

In one exemplary implementation, the soft ferromagnetic cladding layers 570 and 580 may be the same material as the soft reference layer 540. In this implementation, the soft reference layer 540 may form a portion of the soft ferromagnetic cladding layer 570 (e.g., a portion of the cladding around the third conductor 560). Alternatively, the soft ferromagnetic cladding layers 570 and 580 may be made of different material than the soft reference layer 540.

The soft ferromagnetic cladding layers 580 and 570 enclosing at least a portion of the second conductor 550 and the third conductor 560, respectively, provide a closed flux path for read and write magnetic fields, thus, less operating current may be used during operations. Cladding at least a portion of the conductors 550 and 560 may also reduce demagnetization and angular displacement. In some configurations, fringe magnetic fields resulting from read and/or write operations are significantly reduced because fringe magnetic fields emanating from the conductors 550 and 560 may be substantially contained within the soft ferromagnetic cladding layers 580 and 570, respectively. As a result of reduced fringe magnetic fields (thus, reduced magnetic interference) and other reasons memory cell density can be increased.

The soft ferromagnetic cladding layers 570 and 580 may be formed to partially or wholly enclose a portion of the second conductor 550 and the third conductor 560, respectively, in accordance with exemplary processes described in co-pending U.S. patent application incorporated by reference in Section IV above.

The embodiment shown in FIG. 5 is merely illustrative. One skilled in the art will recognize that still other combinations of layers may be formed in accordance with the requirements of a particular implementation. For example, in yet another exemplary configuration, the third conductor 560 may be unclad while at least a portion of the second conductor 550 is clad by the soft ferromagnetic cladding layer 580.

Figure 6A:
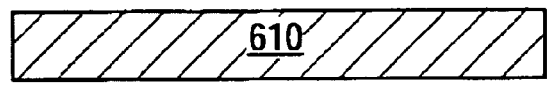
FIGS. 6a–6j illustrate an exemplary process for making the exemplary improved magnetic memory cell of FIG. 5.

VII. An Exemplary Manufacturing Process for the Third Exemplary Improved Memory Cell FIGS. 6a–6j illustrate an exemplary process for manufacturing the exemplary improved memory cell as shown in FIG. 5. In FIG. 6a, a first conducting layer 610 is formed (e.g., via sputtering, evaporation, electroplating, and/or other known methods). The conducting layer 610 is patterned and etched to form the first conductor 510 (not shown).

Figure 6B:
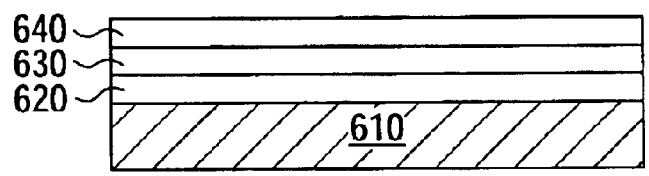

In FIG. 6b, a data layer 620, an intermediate layer (e.g., a tunnel barrier layer) 630, and a soft reference layer 640 are formed via known processing methods.

Figure 6C:
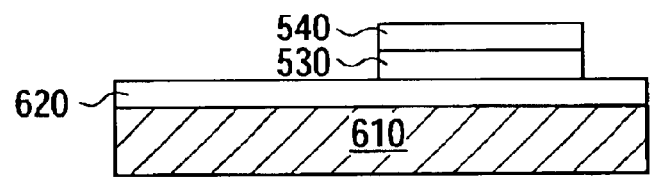

In FIG. 6c, a portion of the intermediate layer 630 and the soft reference layer 640 are etched away using known etching techniques (e.g., coating with photoresist, masking, etching, stripping, etc.). In an exemplary implementation, the remaining structure forms the intermediate layer 530 (e.g., tunnel barrier layer) and the soft reference layer 540 (see FIG. 5).

Figure 6D:
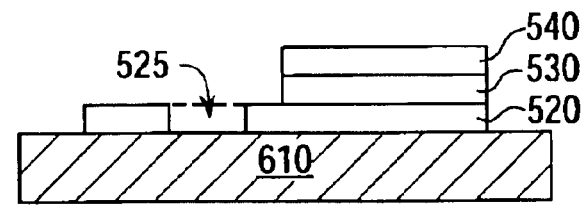

In FIG. 6d, a portion of the data layer 620 is etched away using known etching techniques. In one implementation, the data layer 620 is etched so that the data layer becomes annular (e.g., like a ring, ellipse, circle, washer, etc.) with an opening 525 approximately centered within the annular data layer 520.

Figure 6E:
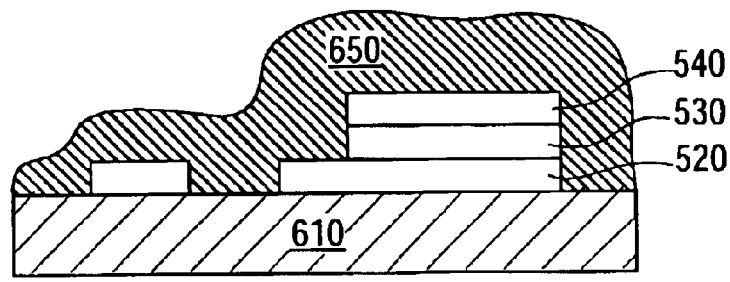

In FIG. 6e, a dielectric layer 650 is formed (e.g., via sputtering, evaporation, deposition, and/or other known techniques).

Figure 6F:
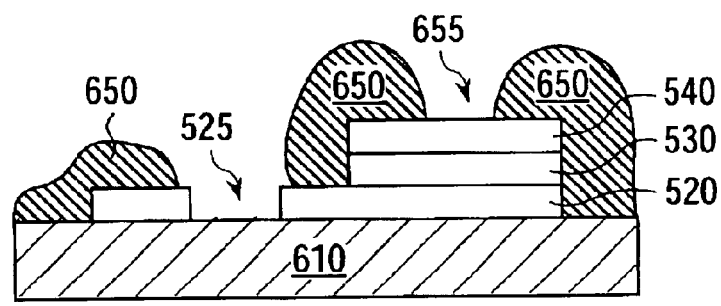

In FIG. 6f, a portion of the dielectric layer 650 is etched away by known etching techniques. In one implementation, if dielectric material fills the opening 525, such dielectric material is removed to restore the opening 525. In addition, an opening 655 is created during the etching process of FIG. 6f to expose a portion of the soft reference layer 540.

Figure 6G:
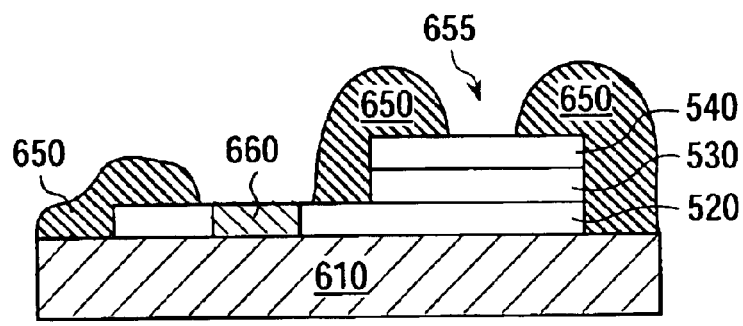

In FIG. 6g, a non-magnetic conducting layer 660 is formed and etched so that opening 525 within the annular data layer 520 surrounds the non-magnetic conducting material. In an exemplary implementation, the non-magnetic conducting material in the opening 525 will become a part of the second conductor 550.

Figure 6H:
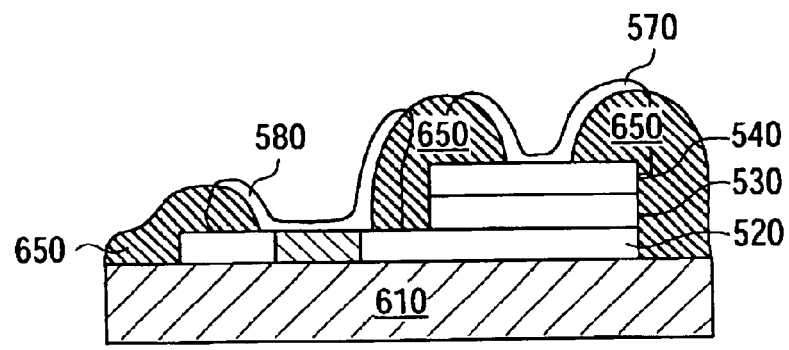

In FIG. 6h, a soft ferromagnetic layer 670 (not shown) is formed and etched so that cladding layers 570 and 580 remain to coat portions of the openings 525 and 655, respectively.

Figure 6I:
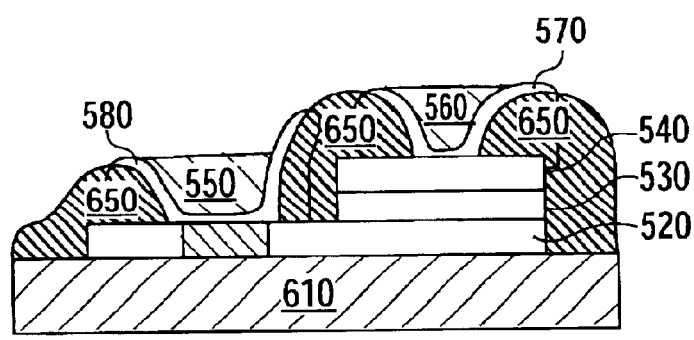

In FIG. 6i, a second conducting layer 680 is formed and etched to fill the rest of the openings 625 and 655. In an exemplary implementation, the conducting layer 680 is patterned to form the second and third conductors 550 and 560, which are enclosed on three sides by soft ferromagnetic cladding layers 570 and 580, respectively.

Figure 6J:
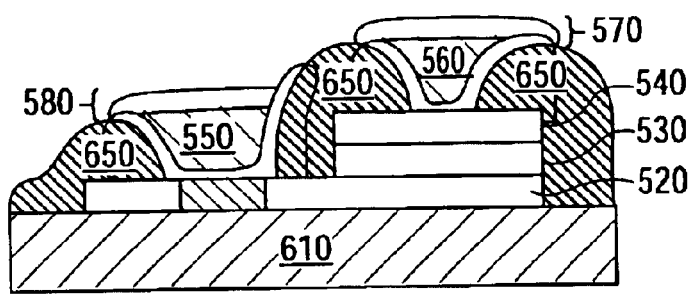

In FIG. 6j, another soft ferromagnetic layer 690 (not shown) is formed and etched so that the second and third conductors 550 and 560 are partially or wholly clad within the soft ferromagnetic cladding layers 580 and 570, respectively.

In this exemplary implementation, the second and third conductors 550 and 560 are partially or wholly clad within the soft ferromagnetic cladding layers 580 and 570, respectively, and extend along an axis orthogonal relative to the first conductor 510. One skilled in the art will recognize that other layouts may also be used in accordance with the requirements of a particular implementation.

The manufacturing steps illustrated above are merely exemplary. Those skilled in the art will appreciate that other manufacturing steps may be used in accordance with the requirements of a particular implementation. For example, the various layers as illustrated in FIGS. 6a–6j may be formed in accordance with other manufacturing sequences, one or more layers may be formed at the same time, one or more layers of different materials may be combined to form a single layer (e.g., a data layer), etc.

Further, the TMR memory cell illustrated above is merely exemplary. Those skilled in the art will appreciate that other types of memory cells (e.g., GMR memory cells, etc.) may be constructed according to the requirements of a particular implementation. For example, the intermediate layer 630 may be a non-magnetic conducting layer for constructing a GMR memory cell.

Figure 7:
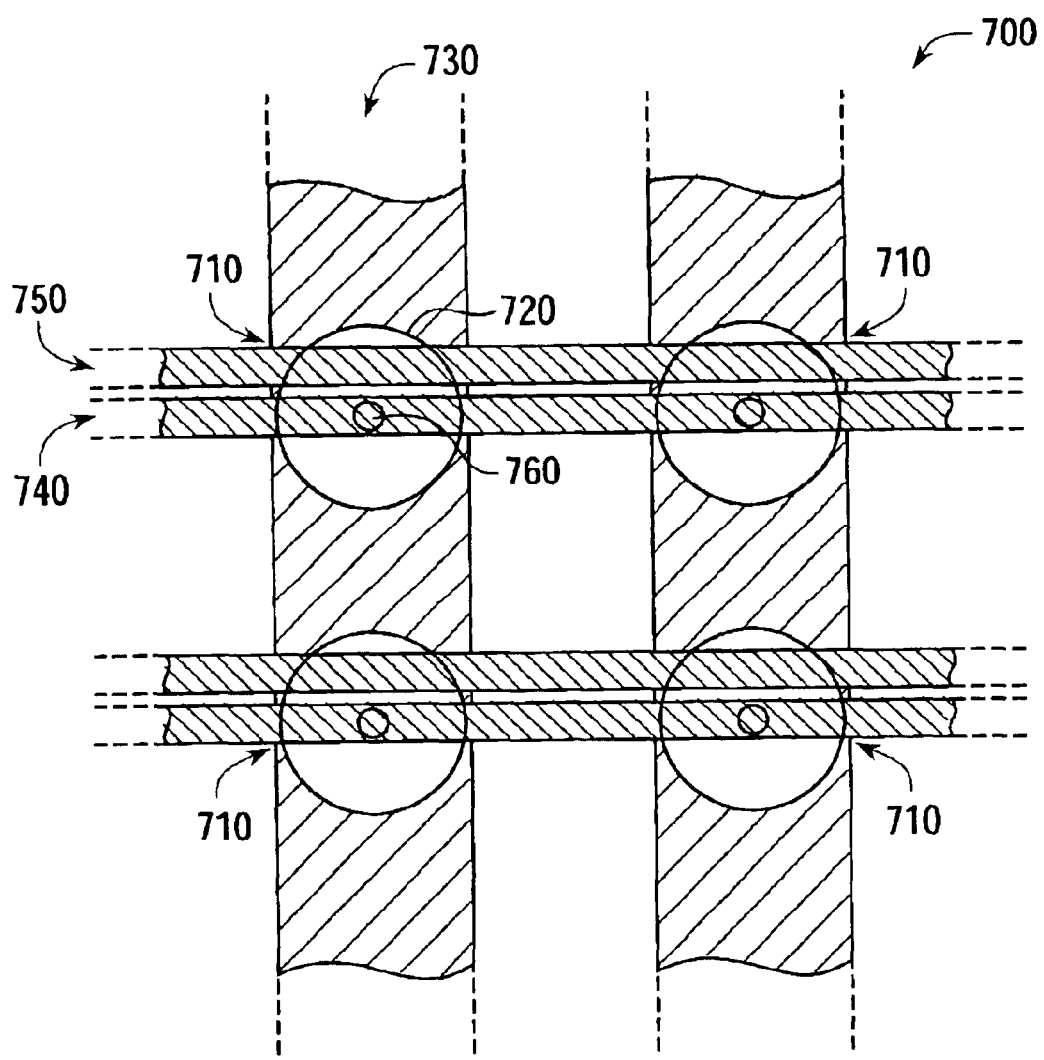
FIG. 7 illustrates a plan view of an exemplary memory array including exemplary memory cells of FIGS. 1, 3, and/or 5.

VIII. An Exemplary Memory Array, Circuit Representation of a Memory Cell, and Other Exemplary Aspects FIG. 7 illustrates a plan view of exemplary multiple improved memory cells in a memory array 700. In particular, memory cells as illustrated in FIG. 7 are representative of the exemplary embodiments described above in Sections II, IV, and VI (see FIGS. 1, 3, and 5) from a different viewpoint. Each exemplary memory cell 710 includes an annular data layer 720, a first conductor 730 along an axis contacting the annular data layer 720, a second conductor 740 and a third conductor 750 along another axis orthogonal to the axis of the first conductor 730, and other components that are hidden from view (e.g., soft reference layer, intermediate layer, etc.). In an exemplary implementation, the second conductor 740 contacts the first conductor 730 via an opening 760 in the annular data layer 720.

In one exemplary implementation, the second and third conductors 740 and 750 may be formed in the same plane or different planes. For example, if the second and third conductors 740 and 750 are in the same plane, their physical locations should be offset by a space 745 wide enough to prevent electric coupling (as shown in FIG. 7). If the second and third conductors 740 and 750 are located in different planes, they may be located along the same or different line along an axis or any other configurations where electric coupling between them will not result.

Although not illustrated in FIG. 7, it is to be understood that in accordance with exemplary implementations as described in Sections IV to VII above, one or more of the second and third conductors 740 and 750 may be partially or wholly clad by soft ferromagnetic materials.

Figure 8:
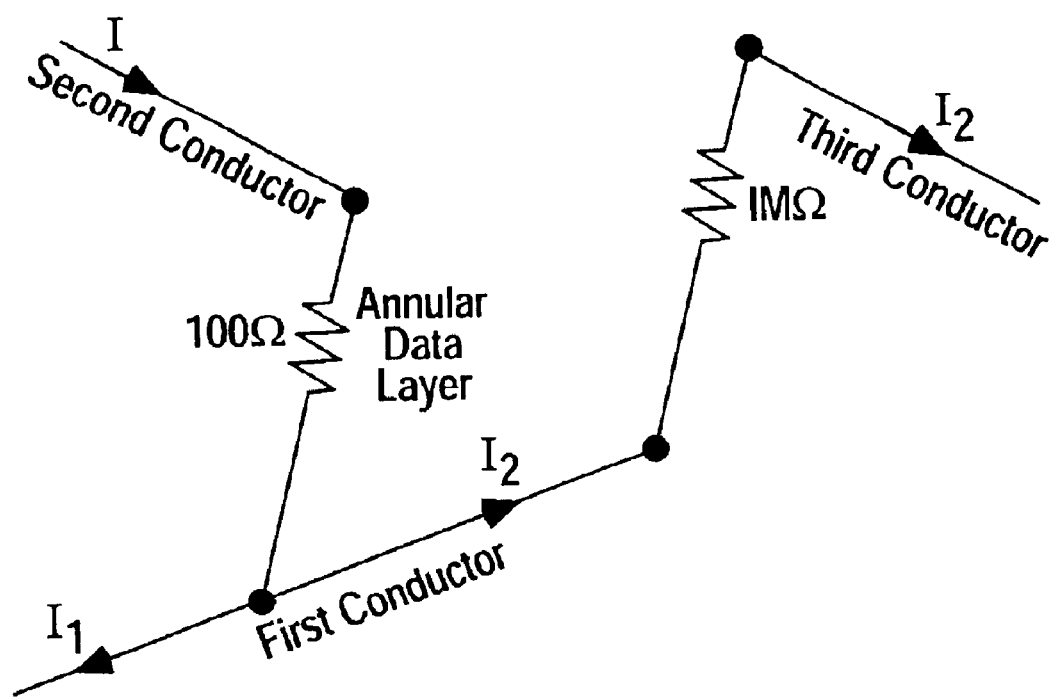
FIG. 8 illustrates an exemplary circuit representation of an exemplary memory cell of FIGS. 1, 3, and/or 5.

FIG. 8 illustrates a circuit representation of the memory cell of FIGS. 1, 3, and/or 5. Typically, when a write current (I) is applied across the second conductor, most of the current (I) flows down through the annular data layer to the first conductor ($I_1$). For a TMR memory cell, a very small leakage current ($I_2$) goes through the magnetic tunnel junction (MTJ) (i.e., the tunnel barrier layer and the soft reference layer). This is because the resistance across the annular data layer is generally substantially less than the resistance across the MTJ. For example, in accordance with materials used in contemporary memory devices, the resistance across the annular data layer is approximately 1 to 100 $\Omega$, whereas the resistance across the MTJ is approximately 1 K$\Omega$ to 1 M$\Omega$.

IX. Conclusion

The foregoing examples illustrate certain exemplary embodiments from which other embodiments, variations, and modifications will be apparent to those skilled in the art. The inventions should therefore not be limited to the particular embodiments discussed above, but rather are defined by the claims.

What is claimed is:

1. A nonvolatile memory array including a plurality of magnetic memory cells, each of said magnetic memory cells being addressable via at least first and second conductors during operations, said memory array being made by a process comprising:
   (a) forming a first conductor;
   (b) forming a ferromagnetic annular data layer on at least a portion of said first conductor;
   (c) forming a second conductor in contact with said first conductor through said annular data layer;
   (d) forming an intermediate layer on at least a portion of said annular data layer; and
   (e) forming a soft reference layer on at least a portion of said intermediate layer.

2. A nonvolatile memory array, said memory array comprising a plurality of magnetic memory cells on a substrate, each of said magnetic memory cells being addressable via at least first and second conductors during operations, said memory array being made by a process comprising:
   (a) forming a ferromagnetic annular data layer having an opening;
      (1) said opening enabling said second conductor to electrically contact said first conductor;
   (b) forming conducting material in said opening, said conducting material:
      (1) comprising a portion of said second conductor contacting said first conductor; and
      (2) being not electrically insulated from said annular data layer;
   (c) forming an intermediate layer on at least a portion of said annular data layer; and
   (d) forming a soft reference layer on at least a portion of said intermediate layer.

3. A nonvolatile memory array, said memory array comprising a plurality of magnetic memory cells formed on a substrate, each of said magnetic memory cells being addressable via at least first and second conductors during operations, said memory array being made by a process comprising:
   (a) forming a ferromagnetic annular data layer having an opening;
      (1) said opening enabling said second conductor to electrically contact said first conductor;
   (b) forming an intermediate layer on at least a portion of said annular data layer;
   (c) forming a soft reference layer on at least a portion of said intermediate layer; and
   (d) forming a third conductor on at least a portion of said soft reference layer;
      (1) said third conductor being at least partially clad by a soft ferromagnetic cladding layer.

* * * * *